(12) United States Patent
Kao et al.

(10) Patent No.: US 10,181,528 B2
(45) Date of Patent: Jan. 15, 2019

(54) THIN-FILM TRANSISTOR AND MANUFACTURING METHOD THEREOF

(71) Applicant: Chunghwa Picture Tubes, LTD., Taoyuan (TW)

(72) Inventors: Chin-Tzu Kao, Changhua County (TW); Chung-Hsu Wang, New Taipei (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 0 days.

(21) Appl. No.: 15/396,822

(22) Filed: Jan. 3, 2017

(65) Prior Publication Data
US 2018/0175206 A1    Jun. 21, 2018

(30) Foreign Application Priority Data

Dec. 16, 2016  (CN) .......................... 2016 1 1165780

(51) Int. Cl.
| | | |
|---|---|---|
| H01L 29/10 | (2006.01) | |
| H01L 29/786 | (2006.01) | |
| H01L 29/66 | (2006.01) | |
| H01L 29/423 | (2006.01) | |
| H01L 21/4763 | (2006.01) | |
| H01L 21/02 | (2006.01) | |

(52) U.S. Cl.
CPC .... *H01L 29/7869* (2013.01); *H01L 21/02164* (2013.01); *H01L 21/02211* (2013.01); *H01L 21/02274* (2013.01); *H01L 21/47635* (2013.01); *H01L 29/42356* (2013.01); *H01L 29/66969* (2013.01); *H01L 29/78606* (2013.01)

(58) Field of Classification Search
None
See application file for complete search history.

(56) References Cited

U.S. PATENT DOCUMENTS

| | | | |
|---|---|---|---|
| 2005/0176226 A1* | 8/2005 | Young | H01L 29/4908 438/533 |
| 2005/0199879 A1* | 9/2005 | Hoffman | H01L 29/7869 257/72 |
| 2006/0091399 A1* | 5/2006 | Lee | H01L 27/12 257/72 |

FOREIGN PATENT DOCUMENTS

TW    I427784    2/2014

* cited by examiner

*Primary Examiner* — Nishath Yasmeen
(74) *Attorney, Agent, or Firm* — JCIPRNET (57) ABSTRACT

The invention relates to a thin-film transistor and a manufacturing method thereof. The manufacturing method of the thin-film transistor includes the following steps: an insulating layer is formed to cover a gate on a substrate; a semiconductor pattern having a first region and a second region is formed on the insulating layer; a plurality of island patterns is formed, wherein at least a portion of the plurality of island patterns is disposed on the semiconductor pattern, and the plurality of island patterns is separated from one another by a gap; and a source and a drain are formed to cover a portion of the plurality of island patterns and fill the gaps to respectively be electrically connected to the first region and the second region of the semiconductor pattern.

8 Claims, 10 Drawing Sheets

THIN-FILM TRANSISTOR AND MANUFACTURING METHOD THEREOF

CROSS-REFERENCE TO RELATED APPLICATION

This application claims the priority benefit of China application serial no. 201611165780.0, filed on Dec. 16, 2016. The entirety of the above-mentioned patent application is hereby incorporated by reference herein and made a part of this specification.

BACKGROUND OF THE INVENTION

Field of the Invention

The invention relates to a semiconductor component and a manufacturing method thereof, and more particularly, to a thin-film transistor and a manufacturing method thereof.

Description of Related Art

A thin-film transistor having an etch-stop layer includes a first type of thin-film transistor and a second type of thin-film transistor. The manufacturing method of the first type of thin-film transistor includes the following steps: a gate is formed on a substrate; an insulating layer is formed to cover the gate; a semiconductor pattern is formed on the insulating layer; an etch-stop layer is formed to cover the semiconductor pattern and the insulating layer; a plurality of contact holes is formed on the etch-stop layer to respectively expose the two ends of the semiconductor pattern; and a source and a drain are formed and filled in the plurality of contact holes to be respectively electrically connected to the two ends of the semiconductor pattern. To make the source and the drain electrically connected to the two ends of the semiconductor pattern, a plurality of contact holes exposing the source and the drain need to be formed in the etch-stop layer. Limited by the process accuracy of the contact holes, the plurality of contact holes need to be spaced apart by a certain distance to avoid connection between the plurality of contact holes due to process errors. However, the distance does not allow the channel length of the thin-film transistor to be further reduced, which is not conductive to the size reduction of the thin-film transistor. The manufacturing method of the second type of thin-film transistor includes the following steps: a gate is formed on a substrate; an insulating layer is formed to cover the gate; a semiconductor pattern is formed on the insulating layer; an etch-stop layer is formed to expose the two ends of the semiconductor pattern; and a source and a drain are formed to respectively cover the two ends of the semiconductor pattern and be respectively electrically connected to the two ends of the semiconductor pattern. However, during the process of forming the etch-stop layer exposing the two ends of the semiconductor pattern, the two ends of the semiconductor pattern are readily damaged such that the electrical properties of the thin-film transistor are affected.

SUMMARY OF THE INVENTION

The invention provides a manufacturing method of a thin-film transistor that can manufacture a small thin-film transistor having good electrical properties.

The invention provides a thin-film transistor having a small size and good electrical properties.

The manufacturing method of a thin-film transistor of the invention includes the following steps: a gate is formed on a substrate; an insulating layer is formed to cover the gate; a semiconductor pattern having a first region and a second region opposite to each other is formed on the insulating layer; a plurality of island patterns are formed, wherein at least a portion of the plurality of island patterns is disposed on the semiconductor pattern, and the plurality of island patterns are separated from each other by gaps; and a source and a drain are formed to cover a portion of the plurality of island patterns and fill the gaps to respectively be electrically connected to the first region and the second region of the semiconductor pattern.

The thin-film transistor of the invention is disposed on the substrate. The thin-film transistor includes a gate, an insulating layer, a semiconductor pattern, a plurality of first island patterns, a plurality of second island patterns, a source, and a drain. The gate is disposed on the substrate. The insulating layer covers the gate. The semiconductor pattern is disposed on the insulating layer. The semiconductor pattern has a first region and a second region opposite to each other. A plurality of first island patterns and a plurality of second island patterns are respectively disposed on the first region and the second region of the semiconductor pattern. The plurality of first island patterns are separated from each other by first gaps. The plurality of second island patterns are separated from one another by second gaps. The source covers the plurality of first island patterns and fills the first gaps to be electrically connected to the first region of the semiconductor pattern. The drain covers the plurality of second island patterns and fills the second gaps to be electrically connected to the second region of the semiconductor pattern.

In an embodiment of the invention, a method of forming the plurality of island patterns includes a half-deposition method.

In an embodiment of the invention, the rate of forming the height of each of the island patterns is greater than 0 Å/sec and less than or equal to 10 Å/sec.

In an embodiment of the invention, the method of forming the plurality of island patterns includes a plasma-enhanced chemical vapor deposition method, the gases used in the plasma-enhanced chemical vapor deposition method include silane and nitrogen oxide, and the process parameters of the plasma-enhanced chemical vapor deposition method include a silane flow rate between 80 sccm and 1600 sccm, a nitrogen oxide flow rate between 5000 sccm and 65000 sccm, a radio frequency power between 80 W and 2300 W, a pressure between 0.4 mbar and 0.6 mbar or between 750 mTorr and 1450 mTorr, and a temperature between 220 Celsius and 350 Celsius.

In an embodiment of the invention, the plurality of island patterns is randomly distributed on the first region and the second region of the semiconductor pattern.

In an embodiment of the invention, the sizes of the plurality of island patterns are not consistent.

In an embodiment of the invention, the method of forming the plurality of island patterns includes a chemical vapor deposition method, and the chemical vapor deposition method includes: a shielding plate is disposed between a semiconductor pattern and a gas source, the shielding plate has a plurality of holes, and the gas from the gas source passes through the plurality of holes of the shielding plate and forms a plurality of island patterns corresponding to the plurality of holes on the semiconductor pattern.

In an embodiment of the invention, the semiconductor pattern further has a third region connected between the first region and the second region, and the plurality of island patterns are further formed on the third region of the semiconductor pattern and a portion of the insulating layer exposed by the semiconductor pattern.

In an embodiment of the invention, the method of forming the source and the drain includes: a conductive layer is formed to cover the plurality of island patterns, the first region, the second region, and the third region of the semiconductor pattern, and the portion of the insulating layer exposed by the semiconductor pattern; and the conductive layer is patterned using a wet etching process to form the source and the drain respectively covering the first region and the second region and exposing the third region of the semiconductor pattern, wherein another portion of the plurality of island patterns located on the third region of the semiconductor pattern and the portion of the insulating layer is kept when the source and the drain are formed.

In an embodiment of the invention, the method of forming the source and the drain includes: a conductive layer is formed to cover the plurality of island patterns, the first region, the second region, and the third region of the semiconductor pattern, and a portion of the insulating layer exposed by the semiconductor pattern; and the conductive layer is patterned using a dry etching process to form the source and the drain respectively covering the first region and the second region and exposing the third region of the semiconductor pattern, wherein another portion of the plurality of island patterns located on the third region of the semiconductor pattern and the portion of the insulating layer exposed by the semiconductor pattern, the source, and the drain is removed when the source and the drain are formed.

In an embodiment of the invention, the other portion of the plurality of island patterns is disposed at two sides of the semiconductor pattern and located on the insulating layer, and the source and the drain further cover the other portion of the plurality of island patterns.

In an embodiment of the invention, the material of the semiconductor pattern includes a metal-oxide-semiconductor.

In an embodiment of the invention, the semiconductor pattern further has a third region connected between the first region and the second region, the source and the drain respectively cover the first region and the second region, and the source and the drain expose the third region. The thin-film transistor further includes a plurality of third island patterns. The plurality of third island patterns are disposed on the third region of the semiconductor pattern. The plurality of third island patterns are separated from each other by third gaps, and the third gaps expose a portion of the third region.

In an embodiment of the invention, the thin-film transistor further includes a plurality of fourth island patterns and a plurality of fifth island patterns. The plurality of fourth island patterns and the plurality of fifth island patterns are respectively disposed at two sides of the semiconductor pattern and located on the insulating layer. The source and the drain further respectively cover the plurality of fourth island patterns and the plurality of fifth island patterns.

In an embodiment of the invention, the thin-film transistor further includes a plurality of sixth island patterns. The plurality of sixth island patterns are disposed on a portion of the insulating layer exposed by the semiconductor pattern, the source, and the drain.

In an embodiment of the invention, the semiconductor pattern further has a third region connected between the first region and the second region, the source and the drain expose the third region of the semiconductor pattern, and the plurality of first island patterns and the plurality of second island patterns expose the third region of the semiconductor pattern and the portion of the insulating layer exposed by the semiconductor pattern, the source, and the drain.

In an embodiment of the invention, the thin-film transistor further includes a plurality of fourth island patterns and a plurality of fifth island patterns. The plurality of fourth island patterns and the plurality of fifth island patterns are respectively disposed at two sides of the semiconductor pattern and located on the insulating layer. The source and the drain further respectively cover the plurality of fourth island patterns and the plurality of fifth island patterns.

Based on the above, in the thin-film transistor and the manufacturing method thereof of an embodiment of the invention, at least a portion of the island patterns is disposed on the semiconductor pattern, and the island patterns are separated from each other by gaps. The source and the drain are filled in the gaps between the island patterns and respectively electrically connected to the first region and the second region of the semiconductor pattern. Compared to the manufacturing process of the first type of thin-film transistor of the prior art, in the manufacturing process of the thin-film transistor of an embodiment of the invention, an etch-stop layer does not need to be first formed, and a plurality of contact holes exposing the source and the drain in the etch-stop layer does not need to be formed. As a result, the length of the channel (i.e., third region) of the thin-film transistor is not limited by the process accuracy of the contact holes, and a small thin-film transistor can be manufactured. Moreover, in the manufacturing process of the thin-film transistor, the plurality of island patterns disposed on the third region of the semiconductor pattern plays the role of protecting the channel of the thin-film transistor during the forming of the source and the drain, such that the thin-film transistor has good electrical properties in addition to the advantage of small size.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
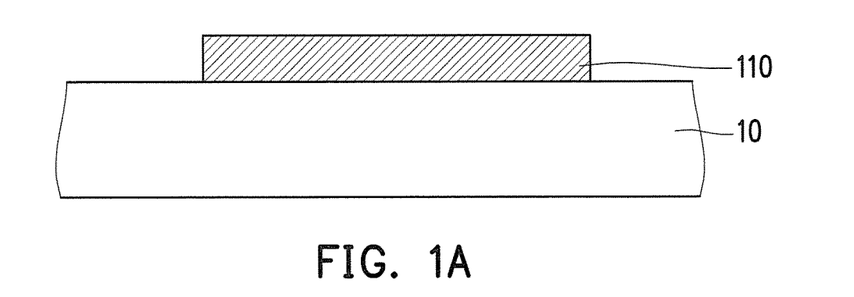
FIG. 1A to FIG. 1G are cross-sectional schematics of the manufacturing process of a thin-film transistor of an embodiment of the invention.

FIG. 1A to FIG. 1G are cross-sectional schematics of the manufacturing process of a thin-film transistor of an embodiment of the invention. Referring first to FIG. 1A, first, a substrate 10 is provided. In the present embodiment, the material of the substrate 10 can be glass, quartz, organic polymer, opaque/reflective material (such as: conductive material, wafer, ceramic) or other suitable materials. Next, a gate 110 is formed on the substrate 10. Specifically, a conductive layer (not shown) can be first formed to cover the substrate 10. Next, a photoresist pattern (not shown) is formed on the conductive layer. Then, the conductive layer is patterned by using the photoresist pattern as a mask to form the gate 110. Out of consideration for conductivity, the gate 110 is generally a metal material. However, the invention is not limited thereto, and based on other embodiments, the gate 110 can also adopt other conductive materials, such as: alloys, nitride of metal materials, oxide of metal materials, nitrogen oxide of metal materials, or stacked layers of metal materials and other conductive materials.

Figure 1B:
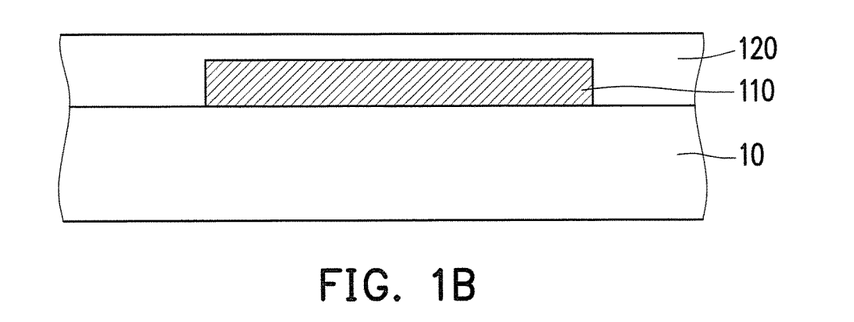

Referring to FIG. 1B, next, an insulating layer 120 is formed to cover the gate 110. In the present embodiment, the insulating layer 120 can comprehensively cover the gate 110 and the substrate 10, but the invention is not limited thereto. The material of the insulating layer 120 can be an inorganic material (such as: silicon oxide, silicon nitride, silicon oxynitride, or stacked layers of at least two of the materials), an organic material, or a combination thereof.

Figure 1C:
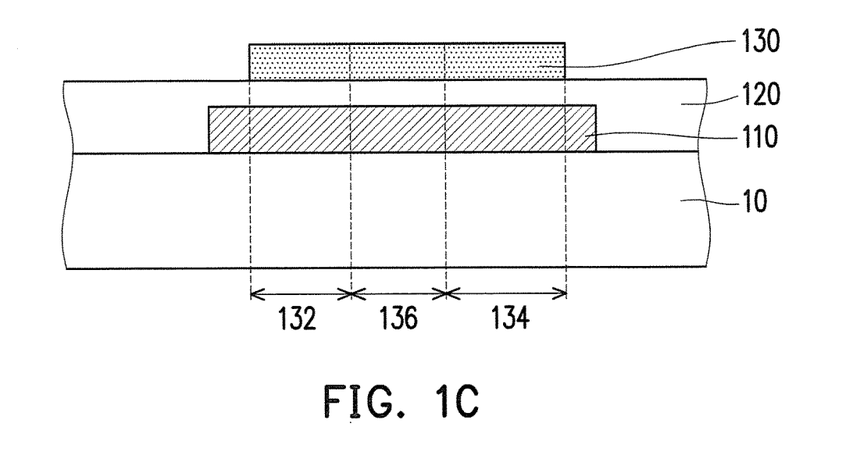

Referring to FIG. 1C, next, a semiconductor pattern 130 is formed on the insulating layer 120. The semiconductor pattern 130 is overlapped with the gate 110. The semiconductor pattern 130 has a first region 132 and a second region 134 opposite to each other. The semiconductor pattern 130 further has a third region 136 connected between the first region 132 and the second region 134. In the present embodiment, the first region 132 and the second region 134 can be located at two ends of the semiconductor pattern 130, and the third region 136 is located between the first region 132 and the second region 134, but the invention is not limited thereto. In the present embodiment, the material of the semiconductor pattern 130 can be a metal-oxide-semiconductor such as: indium-gallium-zinc oxide (IGZO), zinc oxide (ZnO), tin oxide (SnO), indium-zinc oxide (IZO), gallium-zinc oxide (GZO), zinc-tin oxide (ZTO), or indium-tin oxide (ITO). However, the invention is not limited thereto, and in other embodiments, the material of the semiconductor pattern 130 can also be amorphous silicon, polycrystalline silicon, microcrystalline silicon, monocrystalline silicon, organic semiconductor material, oxide semiconductor material, or other suitable materials.

Figure 1D:
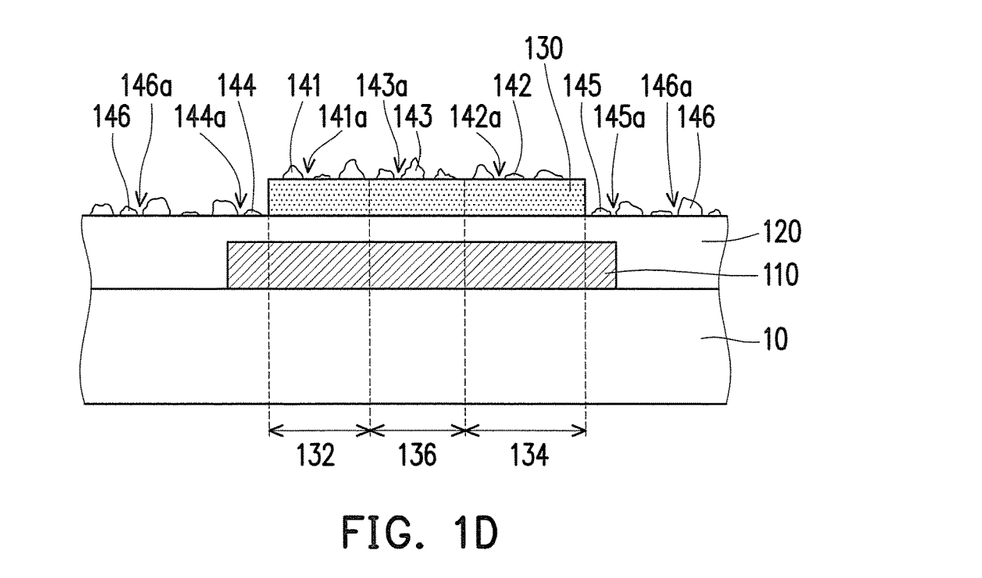

Referring to FIG. 1D, next, a plurality of island patterns 141, 142, 143, 144, 145, and 146 are formed. At least a portion of the island patterns 141, 142, and 143 is disposed on the semiconductor pattern 130. The island patterns 141, 142, 143, 144, 145, and 146 are separated from each other by gaps 141a, 142a, 143a, 144a, 145a, and 146a. The material of the island patterns 141, 142, 143, 144, 145, and 146 is an insulating material, such as silicon oxide (SiOx), wherein x>0. However, the invention is not limited thereto, and in other embodiments, the material of the island patterns 141, 142, 143, 144, 145, and 146 can also be other suitable materials.

In the present embodiment, a half-deposition method can be used to form the island patterns 141, 142, 143, 144, 145, and 146. In the following, the half-deposition method described in the present specification is defined with FIG. 2A to FIG. 2E. FIG. 2A to FIG. 2E show the process of thin-film deposition. Referring to FIG. 2A to FIG. 2E, the thin-film deposition process includes the stage of crystal growth shown in FIG. 2A, the stage of grain growth shown in FIG. 2B, the stage of grain aggregation shown in FIG. 2C, the stage of gap repair shown in FIG. 2D, and the stage of deposited film growth shown in FIG. 2E. In the present specification, the half-deposition method refers to stopping the thin-film deposition process at the stage of grain aggregation shown in FIG. 2C to form the plurality of island patterns 141, 142, 143, 144, 145, and 146 separated from each other without performing the stage of gap repair shown in FIG. 2D and the stage of deposited film growth shown in FIG. 2E.

Figure 2A:
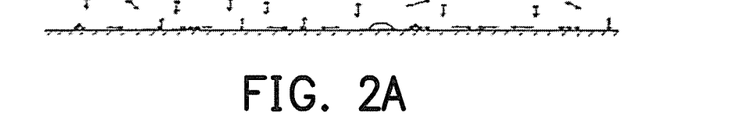
FIG. 2A to FIG. 2E show the process of thin-film deposition.
Figure 2B:
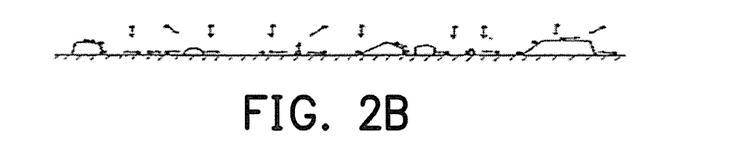
Figure 2C:
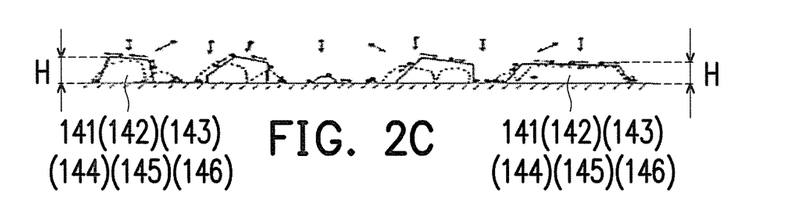
Figure 2D:
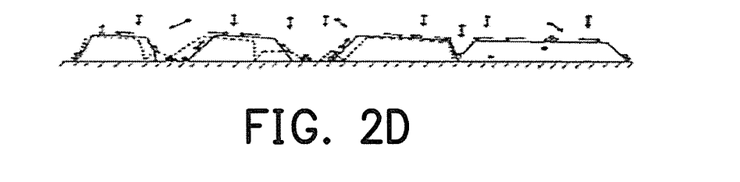
Figure 2E:
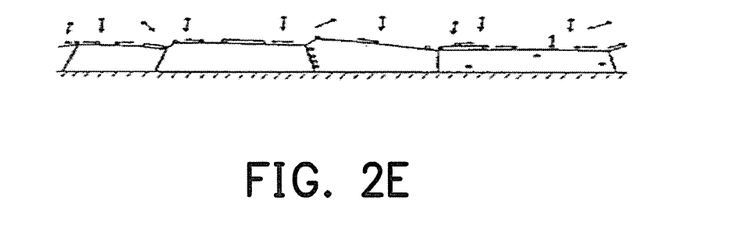

In the present embodiment, the thin-film deposition process can be stopped at the stage of grain aggregation shown in FIG. 2C by adjusting the process parameters to form the plurality of island patterns 141, 142, 143, 144, 145, and 146 separated from each other. In other words, the rate of film forming can be reduced, such as: the rate of forming a height H (shown in FIG. 2C) of each of the island patterns 141, 142, 143, 144, 145, and 146 is greater than 0 Å/sec and less than or equal to 10 Å/sec to form the plurality of island patterns 141, 142, 143, 144, 145, and 146 separated from each other. More specifically, if a plasma-enhanced chemical vapor deposition (PECVD) method is adopted, then the gas flow can be reduced, the radio frequency power is adjusted, and the pressure and/or temperature is adjusted to form the plurality of island patterns 141, 142, 143, 144, 145, and 146 separated from each other. Specifically, the gases used in the PECVD method can include silane ($SiH_4$) and nitrogen oxide ($N_2O$), and the process parameters of the PECVD method include a silane flow rate between 80 sccm and 1600 sccm, a nitrogen oxide flow rate between 5000 sccm and 65000 sccm, a radio frequency power between 80 W and 2300 W, a pressure between 0.4 mbar and 0.6 mbar or between 750 mTorr and 1450 mTorr, and a temperature between 220 Celsius and 350 Celsius.

In addition to adjusting process parameters such as gas flow, radio frequency power, pressure and/or temperature, the thin-film deposition time can also be adjusted to form the plurality of island patterns 141, 142, 143, 144, 145, and 146 separated from each other. Specifically, after thin-film deposition is performed for a period of time (such as: 2 to 5 seconds), thin-film deposition is stopped; then, thin-film deposition is performed again for a period of time (such as: 2 to 5 seconds), and then thin-film deposition is stopped again. By suitably repeating the action of performing the thin-film deposition and stopping the thin-film deposition, the plurality of island patterns 141, 142, 143, 144, 145, and 146 separated from one another can also be formed. It should be mentioned that, the process parameters (such as: time, gas flow, radio frequency power, and pressure and/or temperature) are exemplary in the invention and are not intended to limit the invention, and other suitable adjustments can be made to the process parameters forming the island patterns 141, 142, 143, 144, 145, and 146 based on actual situation.

Figure 1E:
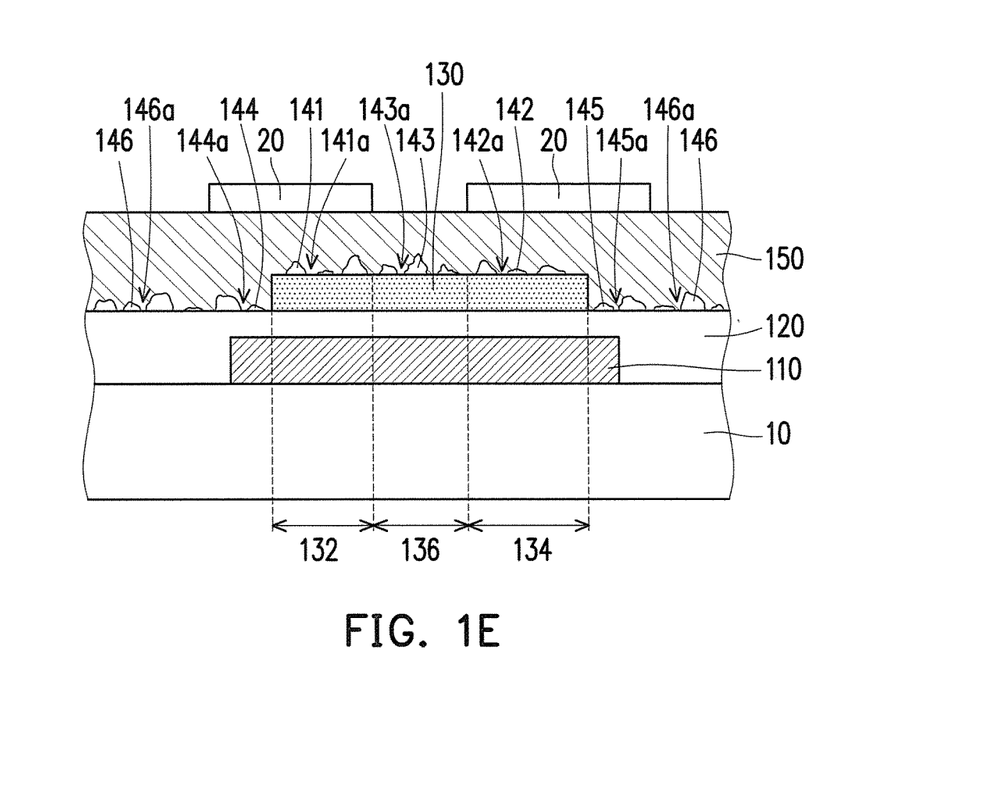
Figure 1F:
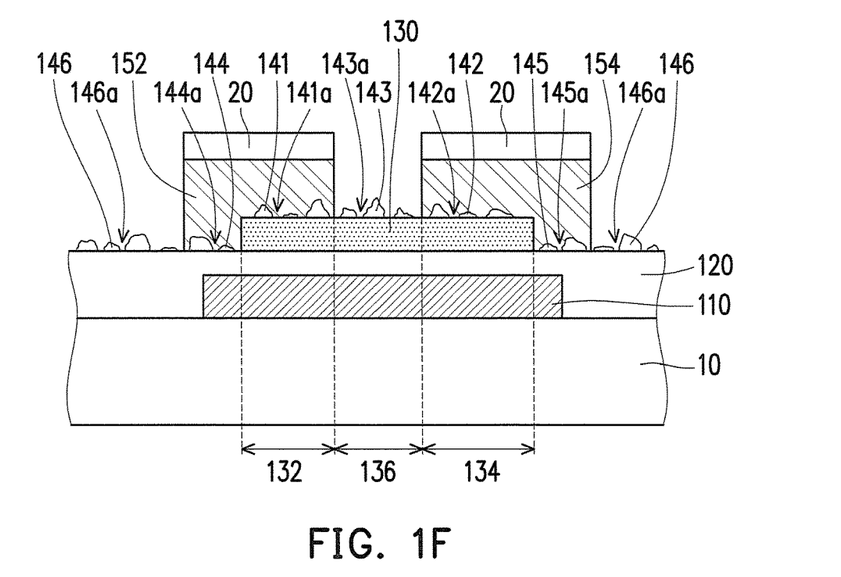
Figure 1G:
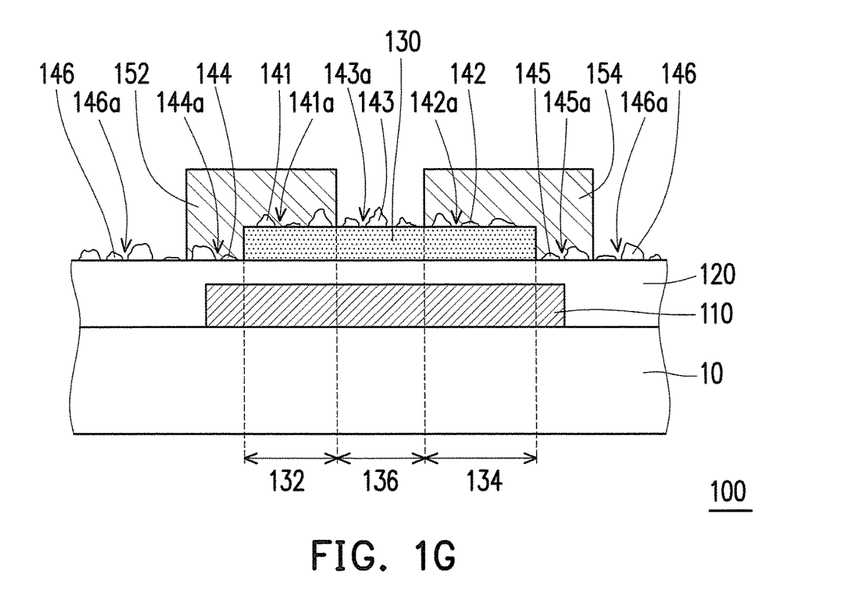

Referring to FIG. 1E, next, the conductive layer 150 is formed to cover the island patterns 141, 142, 143, 144, 145, and 146, the first region 132, the second region 134, and the third region 136 of the semiconductor pattern 130, and a portion of the insulating layer 120 exposed by the semiconductor pattern 130. The material for the conductive layer 150 is similar to the material for the gate 110 and is not repeated herein. Referring to FIG. 1E, next, a photoresist pattern 20 is formed on the conductive layer 150. Referring to FIG. 1E and FIG. 1F, next, in the present embodiment, the conductive layer 150 can be patterned using a wet etching process by using the photoresist pattern 20 as a mask to form the source 152 and the drain 154. The source 152 and the drain 154 cover the island patterns 141 and 142 and fill the gaps 141a and 142a to respectively be electrically connected to the first region 132 and the second region 134 of the semiconductor pattern 130. The etchant used in the wet etching process does not readily damage the island patterns 143 and 146 not overlapped with the photoresist pattern 20 when the source 152 and the drain 154 are formed, and the island patterns 143 and 146 located on the third region 136 of the semiconductor pattern 130 and a portion of the insulating layer 120 can be kept. Referring to FIG. 1F and FIG. 1G, next, the photoresist pattern 20 can be removed. At this point, the thin-film transistor 100 of the present embodiment is complete.

It should be mentioned that, in the manufacturing process of the thin-film transistor 100, at least a portion of the island patterns 141, 142, and 143 is disposed on the semiconductor pattern 130, and the island patterns 141, 142, and 143 are separated from each other by gaps 141a, 142a, and 143a. The source 152 and the drain 154 can be filled in the gaps 141a and 142a between the island patterns 141 and 142 and respectively be electrically connected to the first region 132 and the second region 134 of the semiconductor pattern 130. Compared to the manufacturing process of the first type of thin-film transistor of the prior art, in the manufacturing process of the thin-film transistor 100, an etch-stop layer does not need to be formed, and a plurality of contact holes exposing the source and the drain formed in the etch-stop layer is not needed. As a result, the length of the channel (i.e., the third region 136) of the thin-film transistor 100 is not limited by the process accuracy of the contact holes, and a small thin-film transistor 100 can be manufactured. Moreover, in the manufacturing process of the thin-film transistor 100, the island patterns 143 formed on the semiconductor pattern 130 play the role of protecting the channel (i.e., the third region 136) of the thin-film transistor 100 during the forming process of the source 152 and the drain 154, such that the thin-film transistor 100 has good electrical properties in addition to the advantage of small size.

Referring to FIG. 1G, the thin-film transistor 100 includes a gate 110, an insulating layer 120, a semiconductor pattern 130, island patterns 141 and 142, a source 152, and a drain 154. The gate 110 is disposed on the substrate 10. The insulating layer 120 covers the gate 110. The semiconductor pattern 130 is disposed on the insulating layer 120. The semiconductor pattern 130 has a first region 132 and a second region 134 opposite to each other. The plurality of island patterns 141 and 142 are respectively disposed on the first region 132 and the second region 134 of the semiconductor pattern 130. The plurality of island patterns 141 is separated from each other by the gaps 141a. The plurality of island patterns 142 is separated from each other by the gaps 142a. The source 152 covers the plurality of island patterns 141 and fills the gaps 141a to be electrically connected to the first region 132 of the semiconductor pattern 130. The drain 154 covers the plurality of island patterns 142 and fills the gaps 142a to be electrically connected to the second region 134 of the semiconductor pattern 130.

The semiconductor pattern 130 further has a third region 136 connected between the first region 132 and the second region 134. The source 152 and the drain 154 respectively cover the first region 132 and the second region 134. The source 152 and the drain 154 expose the third region 136. In the present embodiment, the thin-film transistor 100 further includes a plurality of island patterns 143. The island patterns 143 are disposed on the third region 136 of the semiconductor pattern 130. The island patterns 143 are separated from each other by the gaps 143a. The gaps 143a expose a portion of the third region 136. The thin-film transistor 100 further includes a plurality of island patterns 144 and a plurality of island patterns 145. The island patterns 144 and the island patterns 145 are respectively disposed at two sides of the semiconductor pattern 130 and located on the insulating layer 120. The source 152 and the drain 154 respectively cover the plurality of island patterns 144 and the plurality of island patterns 145. More specifically, gaps 144a exist between the plurality of island patterns 144, and the source 152 can be filled in the gaps 144a and be in contact with the insulating layer 120. Gaps 145a exist between the plurality of island patterns 145, and the drain 154 can be filled in the gaps 154a and be in contact with the insulating layer 120. The thin-film transistor further includes a plurality of island patterns 146. The island patterns 146 are disposed on the semiconductor pattern 130 and a portion of the insulating layer 120 exposed by the source 152 and the drain 154. Gaps 146a exist between the plurality of island patterns 146, and a portion of the insulating layer 120 is exposed by the gaps 146a.

In particular, in the present embodiment, since the island patterns 141, 142, 143, 144, 145, and 146 are formed by a half-deposition method, the island patterns 141 and 142 are randomly distributed on the first region 132 and the second region 134 of the semiconductor pattern 130, the island patterns 143 are randomly distributed on the third region 136 of the semiconductor pattern 130, and the island patterns 144, 145, and 146 are randomly distributed on the insulating layer 120. More specifically, since the island patterns 141, 142, 143, 144, 145, and 146 are formed by a half-deposition method, the island patterns 141, 142, 143, 144, 145, and 146 further have the characteristic of inconsistent size. Specifically, the areas of a plurality of orthographic projections of the island patterns 141, 142, 143, 144, 145, and 146 on the substrate 10 can be inconsistent, and the height H (shown in FIG. 2C) of the island patterns 141, 142, 143, 144, 145, and 146 can also be inconsistent.

FIG. 3A to FIG. 3G are cross-sectional schematics of the manufacturing process of a thin-film transistor of another embodiment of the invention. The manufacturing process of the thin-film transistor of FIG. 3A to FIG. 3G is similar to the manufacturing process of the thin-film transistor of FIG. 1A to FIG. 1G, and therefore the same or corresponding components are represented by the same or corresponding reference numerals. The main difference between the manufacturing process of the thin-film transistor of FIG. 3A to FIG. 3G and the manufacturing process of the thin-film transistor of FIG. 1A to FIG. 1G is that, the methods of forming the source 152 and the drain 154 of the two are different. The following mainly describes the difference, and the same or corresponding parts of the two are as described above.

Figure 3A:
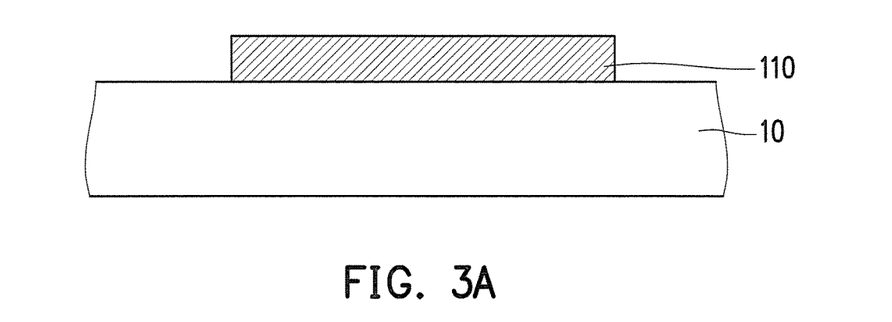
FIG. 3A to FIG. 3G are cross-sectional schematics of the manufacturing process of a thin-film transistor of another embodiment of the invention.
Figure 3B:
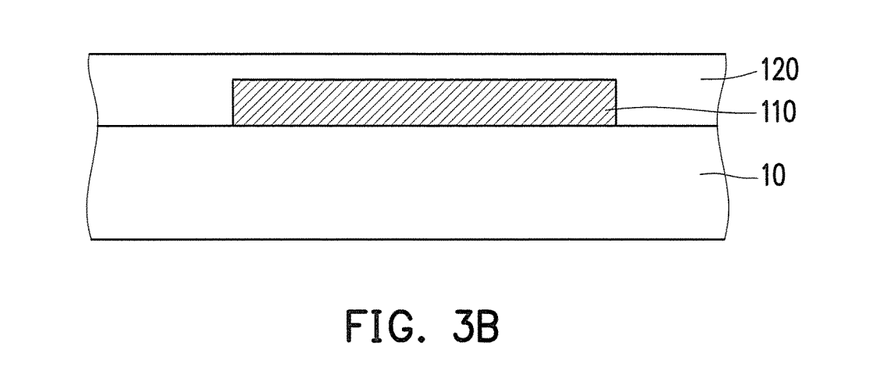
Figure 3C:
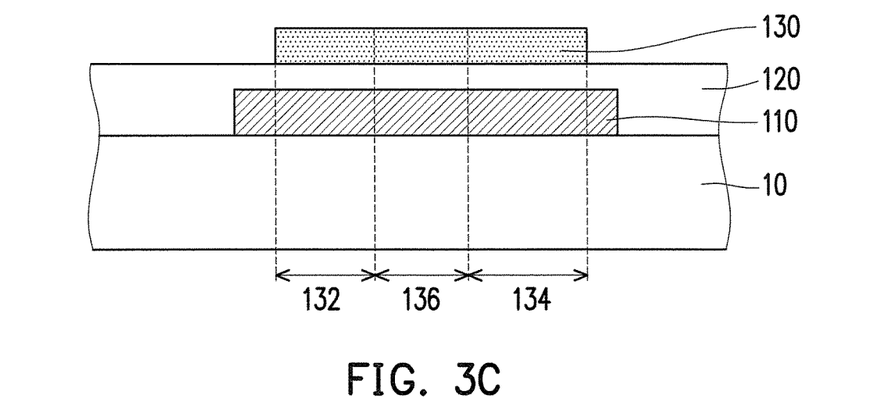
Figure 3D:
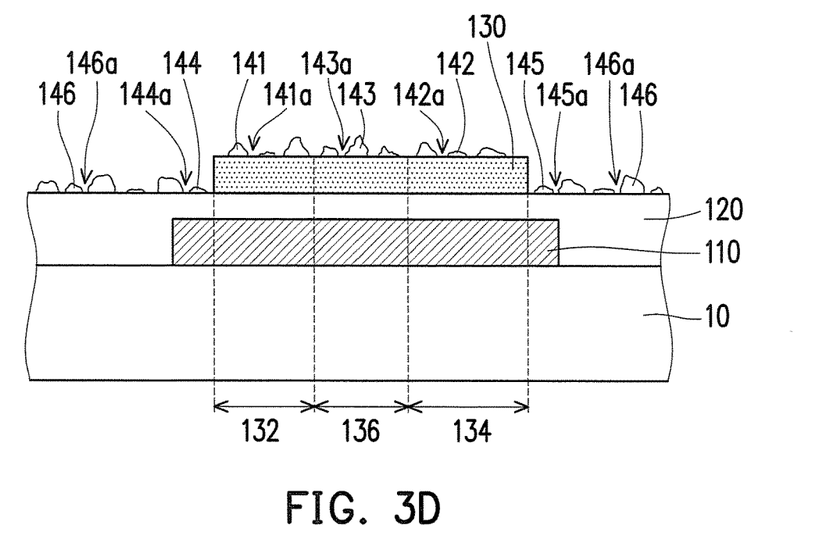
Figure 3E:
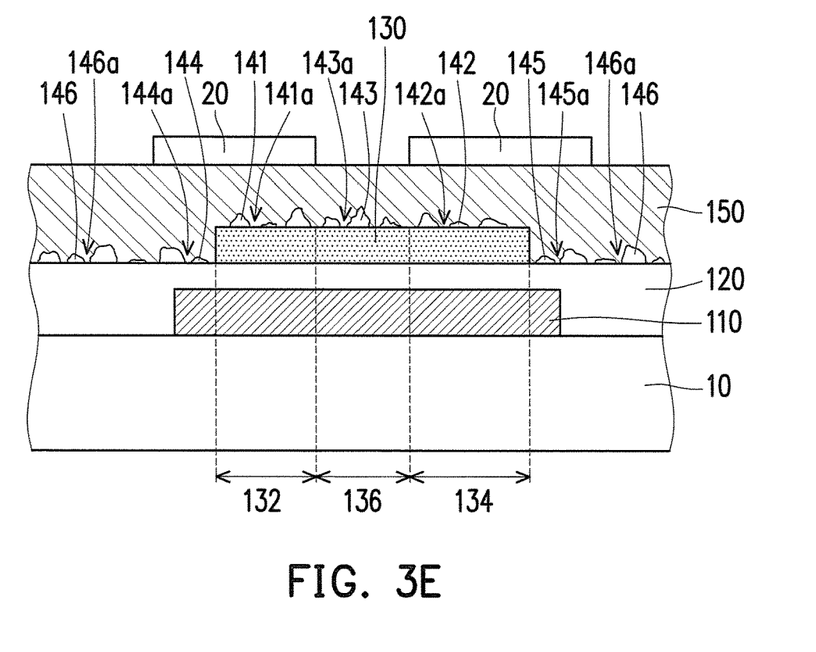

Referring first to FIG. 3A, first, a substrate 10 is provided. Next, a gate 110 is formed on the substrate 10. Referring to FIG. 3B, next, an insulating layer 120 is formed to cover the gate 110. Referring to FIG. 3C, next, a semiconductor pattern 130 is formed on the insulating layer 120. Referring to FIG. 3D, next, a plurality of island patterns 141, 142, 143, 144, 145, and 146 are formed. In the present embodiment, a half-deposition method can also be used to form the island patterns 141, 142, 143, 144, 145, and 146. Referring to FIG. 3E, next, the conductive layer 150 is formed to cover the island patterns 141, 142, 143, 144, 145, and 146, the first region 132, the second region 134, and the third region 136 of the semiconductor pattern 130, and a portion of the insulating layer 120 exposed by the semiconductor pattern 130. Next, a photoresist pattern 20 is formed on the conductive layer 150.

Figure 3F:
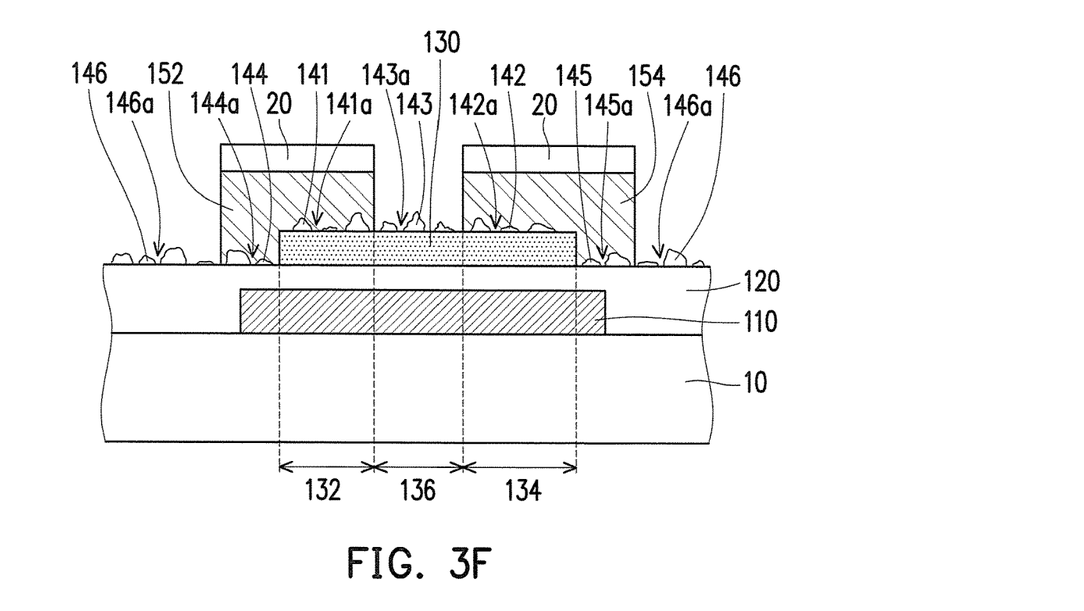

Referring to FIG. 3E and FIG. 3F, the differences from the embodiment of FIG. 1A to FIG. 1G are that, in the present embodiment, the conductive layer 150 is patterned using a dry etching process by using the photoresist pattern 20 as a mask to form the source 152 and the drain 154 respectively covering the first region 132 and the second region 134 and exposing the third region 136 of the semiconductor pattern 130. In particular, the island patterns 143 located on the third region 136 of the semiconductor pattern 130 and the island patterns 146 on a portion of the insulating layer 120 exposed by the semiconductor pattern 130, the source 152, and the drain 154 are removed when the source 152 and the drain 154 are formed. In other words, the island patterns 143 located on the third region 136 can be used as sacrificial patterns to protect the third region 136 of the semiconductor pattern 130 from damage during the forming process of the source 152 and the drain 154. Next, the photoresist pattern 20 can be removed. At this point, a thin-film transistor 100A of the present embodiment is complete.

Figure 3G:
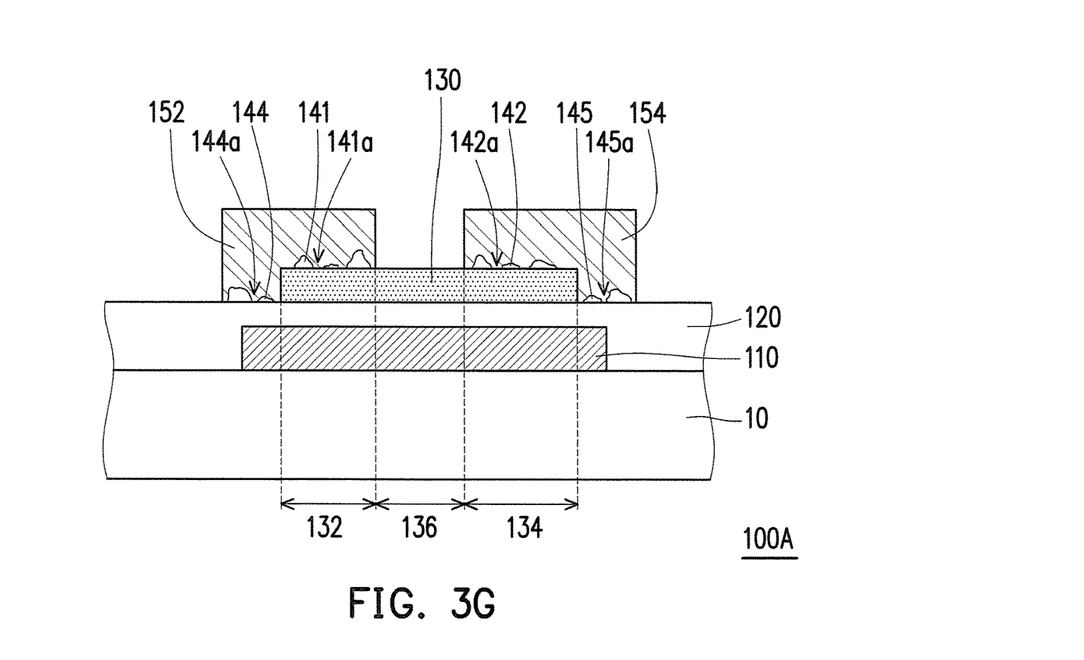

Referring to FIG. 3G, the thin-film transistor 100A includes a gate 110, an insulating layer 120, a semiconductor pattern 130, island patterns 141 and 142, a source 152, and a drain 154. The gate 110 is disposed on the substrate 10. The insulating layer 120 covers the gate 110. The semiconductor pattern 130 is disposed on the insulating layer 120. The semiconductor pattern 130 has a first region 132 and a second region 134 opposite to each other. The plurality of island patterns 141 and 142 are respectively disposed on the first region 132 and the second region 134 of the semiconductor pattern 130. The plurality of island patterns 141 are separated from each other by gaps 141a. The plurality of island patterns 142 are separated from one another by gaps 142a. The source 152 covers the plurality of island patterns 141 and fills the gaps 141a to be electrically connected to the first region 132 of the semiconductor pattern 130. The drain 154 covers the plurality of island patterns 142 and fills the gaps 142a to be electrically connected to the second region 134 of the semiconductor pattern 130.

The semiconductor pattern 130 further has a third region 136 connected between the first region 132 and the second region 134. The source 152 and the drain 154 respectively cover the first region 132 and the second region 134. The source 152 and the drain 154 expose the third region 136. In the present embodiment, the thin-film transistor 100A further includes a plurality of island patterns 144 and a plurality of island patterns 145. The island patterns 144 and the island patterns 145 are respectively disposed at two sides of the semiconductor pattern 130 and located on the insulating layer 120. The source 152 and the drain 154 respectively cover the plurality of island patterns 144 and the plurality of island patterns 145. More specifically, gaps 144a exist between the plurality of island patterns 144, and the source 152 can be filled in the gaps 144a and be in contact with the insulating layer 120. Gaps 145a exist between the plurality of island patterns 145, and the drain 154 can be filled in the gaps 154a and be in contact with the insulating layer 120. The plurality of island patterns 141, 142, 144, and 145 expose the third region 136 of the semiconductor pattern 130 and a portion of the insulating layer 120 exposed by the semiconductor pattern 130, the source 152, and the drain 154. In short, compared to the thin-film transistor 100, the thin-film transistor 100A omits the island patterns 143 and 146. The thin-film transistor 100A and the manufacturing method thereof have similar effects and advantages as the thin-film transistor 100 and the manufacturing method thereof, and are not repeated herein.

FIG. 4A to FIG. 4G are cross-sectional schematics of the manufacturing process of a thin-film transistor of yet another embodiment of the invention. The manufacturing process of the thin-film transistor of FIG. 4A to FIG. 4G is similar to the manufacturing process of the thin-film transistor of FIG. 1A to FIG. 1G, and therefore the same or corresponding components are represented by the same or corresponding reference numerals. The main difference between the manufacturing process of the thin-film transistor of FIG. 4A to FIG. 4G and the manufacturing process of the thin-film transistor of FIG. 1A to FIG. 1G is that, the forming methods of the island patterns 141, 142, 143, 144, 145, and 146 are different. The following mainly describes the difference, and the same or corresponding parts of the two are as described above.

Referring first to FIG. 3A, first, a substrate 10 is provided. Next, a gate 110 is formed on the substrate 10. Referring to FIG. 3B, next, an insulating layer 120 is formed to cover the gate 110. Referring to FIG. 3C, next, a semiconductor pattern 130 is formed on the insulating layer 120. Referring to FIG. 3D, next, a plurality of island patterns 141, 142, 143, 144, 145, and 146 are formed. In the present embodiment, the plurality of island patterns 141, 142, 143, 144, 145, and 146 can be formed using a chemical vapor deposition method, and the difference from the embodiment of FIG. 1A to FIG. 1G is that, during the process of forming the plurality of island patterns 141, 142, 143, 144, 145, and 146 using a chemical vapor deposition method, a shielding plate 40 is disposed between the semiconductor pattern 130 and the gas source 30, the shielding plate 40 has a plurality of holes 42, and the gas 32 from the gas source 30 passes through the plurality of holes 42 of the shielding plate 40 and forms the plurality of island patterns 141, 142, 143, 144, 145, and 146 corresponding to the plurality of holes 42 on the semiconductor pattern 130 and the insulating layer 120. Via the function of the shielding plate 40, the manufacturer does not need to particularly adjust the process parameters of the chemical vapor deposition method (in other words, suitable process parameters can be readily found for the chemical vapor deposition method) to form the plurality of island patterns 141, 142, 143, 144, 145, and 146 separated from each other by the gaps 141a, 142a, 143a, 44a, 145a, and 146a.

Figure 4A:
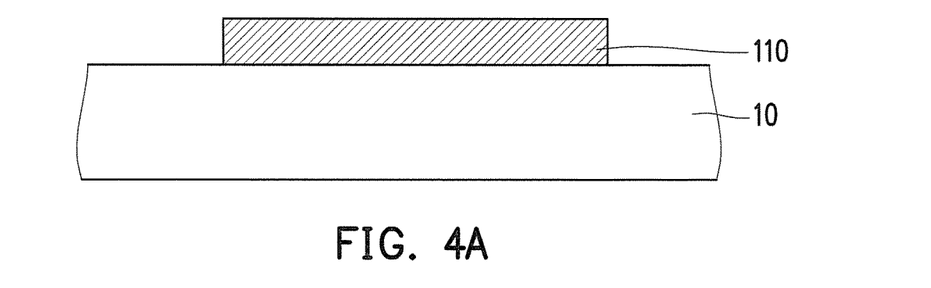
FIG. 4A to FIG. 4G are cross-sectional schematics of the manufacturing process of a thin-film transistor of yet another embodiment of the invention.
Figure 4B:
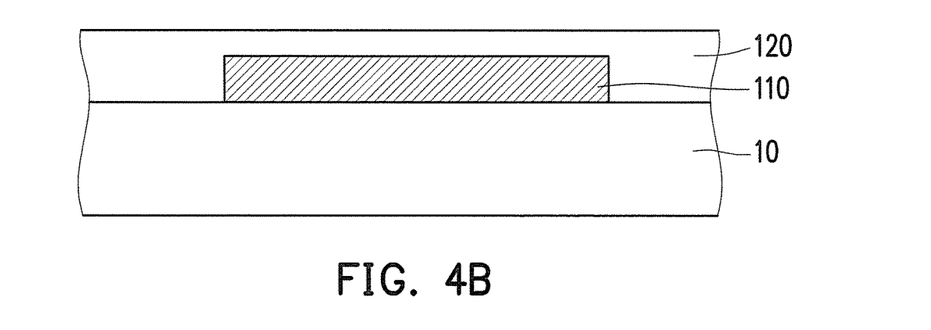
Figure 4C:
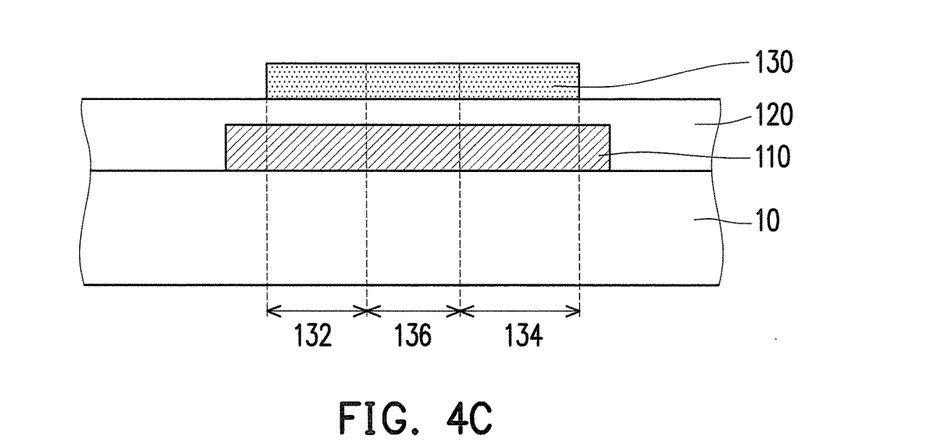
Figure 4D:
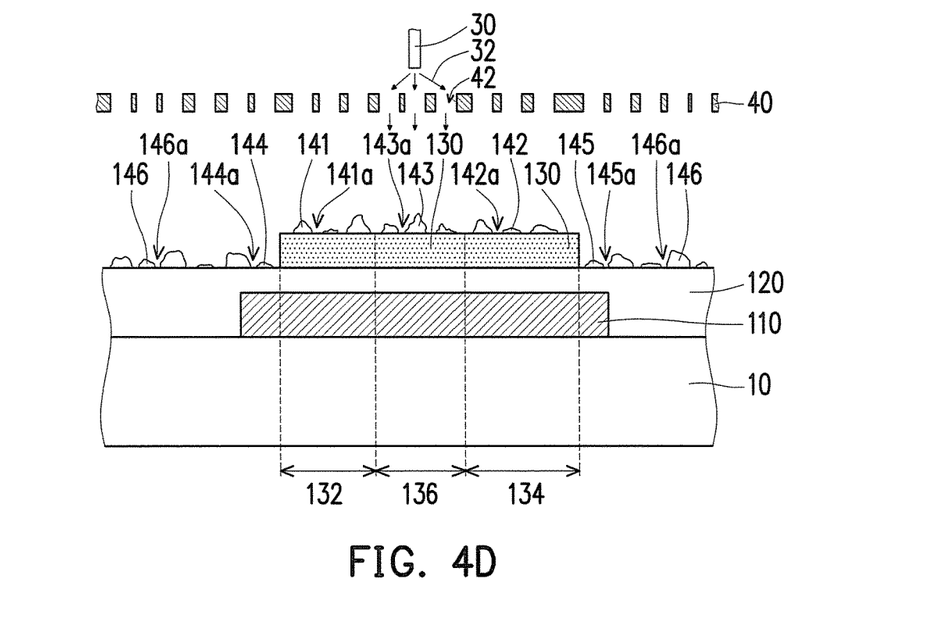
Figure 4E:
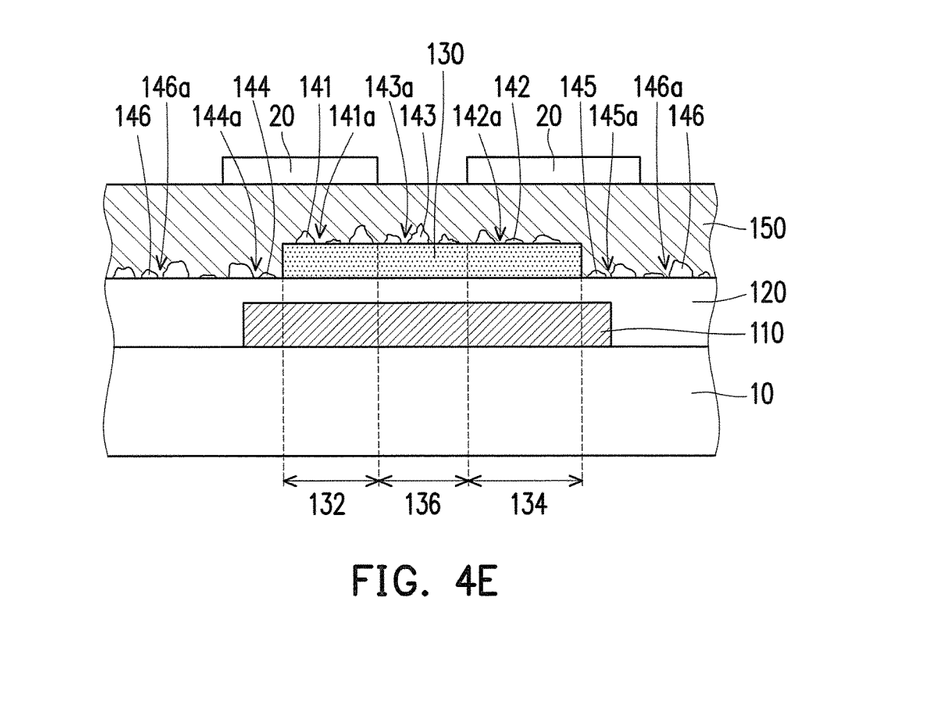
Figure 4F:
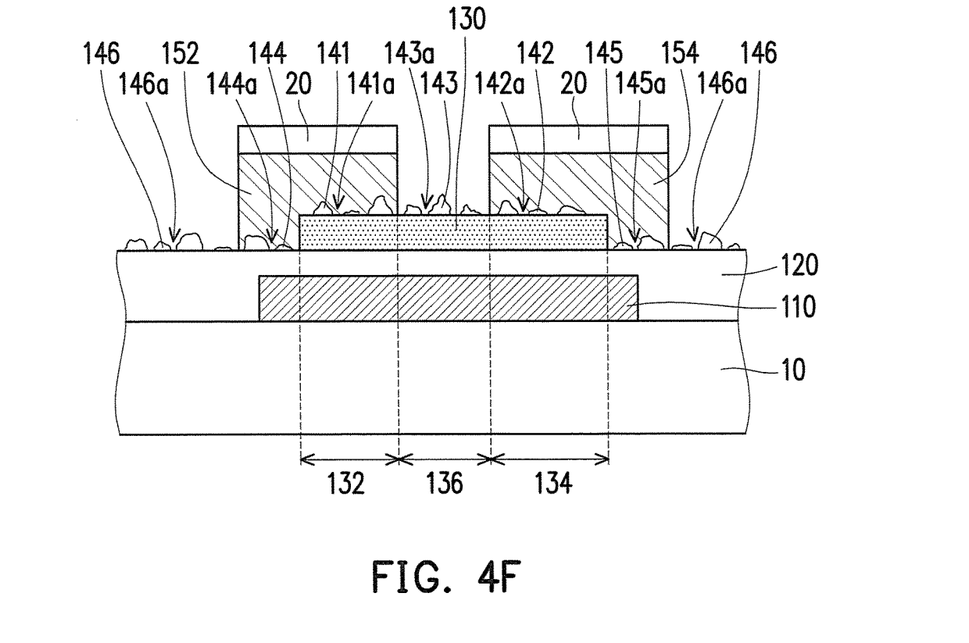
Figure 4G:
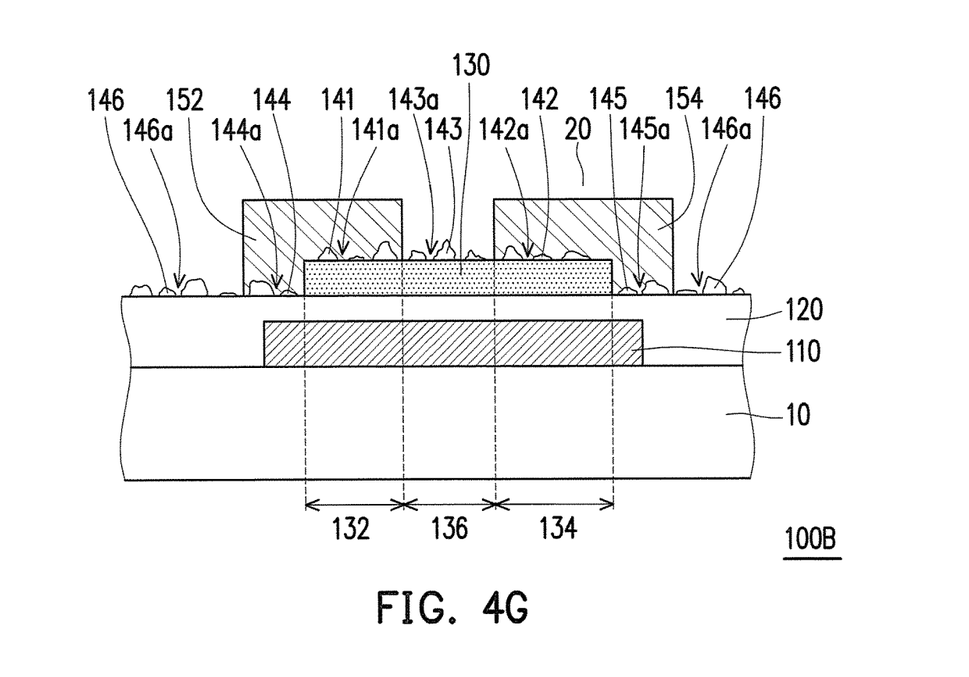

Referring to FIG. 4E, next, the conductive layer 150 is formed to cover the island patterns 141, 142, 143, 144, 145, and 146, the first region 132, the second region 134, and the third region 136 of the semiconductor pattern 130, and a portion of the insulating layer 120 exposed by the semiconductor pattern 130. Next, a photoresist pattern 20 is formed on the conductive layer 150. Referring to FIG. 4E and FIG. 4F, next, in the present embodiment, the conductive layer 150 can be patterned by using the photoresist pattern 20 as a mask to form the source 152 and the drain 154. The source 152 and the drain 154 cover the island patterns 141 and 142 and fill the gaps 141a and 142a to respectively be electrically connected to the first region 132 and the second region 134 of the semiconductor pattern 130. Referring to FIG. 4F and FIG. 4G, next, the photoresist pattern 20 can be removed. At this point, a thin-film transistor 100B of the present embodiment is complete. The structures of the thin-film transistor 100B and the thin-film transistor 100 are similar, and the thin-film transistor 100B and the manufacturing method thereof have similar effects and advantages as the thin-film transistor 100 and the manufacturing method thereof, and are not repeated herein.

Based on the above, in the thin-film transistor and the manufacturing method thereof of an embodiment of the invention, at least a portion of the island patterns is disposed on the semiconductor pattern, and the island patterns are separated from each other by gaps. The source and the drain are filled in the gaps between the island patterns and respectively electrically connected to the first region and the second region of the semiconductor pattern. Compared to the manufacturing process of the first type of thin-film transistor of the prior art, in the manufacturing process of the thin-film transistor of an embodiment of the invention, an etch-stop layer does not need to be first formed, and a plurality of contact holes exposing the source and the drain in the etch-stop layer does not need to be formed. As a result, the length of the channel (i.e., third region) of the thin-film transistor is not limited by the process accuracy of the contact holes, and a small thin-film transistor can be manufactured. Moreover, in the manufacturing process of the thin-film transistor, the plurality of island patterns disposed on the third region of the semiconductor pattern plays the role of protecting the channel of the thin-film transistor during the forming of the source and the drain, such that the thin-film transistor has good electrical properties in addition to the advantage of small size.

Lastly, it should be mentioned that: each of the above embodiments is only used to describe the technical solutions of the invention and is not intended to limit the invention; and although the invention is described in detail via each of the above embodiments, those having ordinary skill in the art should understand that: modifications can still be made to the technical solutions recited in each of the above embodiments, or portions or all of the technical features thereof can be replaced to achieve the same or similar results; and the modifications or replacements do not make the nature of corresponding technical solutions depart from the scope of the technical solutions of each of the embodiments of the invention.

What is claimed is:

1. A thin-film transistor disposed on a substrate, wherein the thin-film transistor comprises:
    a gate disposed on the substrate;
    an insulating layer covering the gate;
    a semiconductor pattern disposed on the insulating layer, wherein the semiconductor pattern has a first region and a second region opposite to each other;
    a plurality of first island patterns and a plurality of second island patterns respectively directly disposed on the first region and the second region of the semiconductor pattern, wherein each of the plurality of first island patterns is in a grain form, the first island patterns are separated from each other by a plurality of first gaps, each of the plurality of second island patterns is in a grain form, the second island patterns are separated from each other by a plurality of second gaps, the first gaps expose a portion of the first region and the second gaps expose a portion of the second region, and a material of the first island patterns and the second island patterns is an insulating material;
    a source electrode and a drain electrode, wherein the source electrode covers the plurality of first island patterns and fills the first gaps to be electrically connected to the first region of the semiconductor pattern, and the drain electrode covers the plurality of second island patterns and fills the second gaps to be electrically connected to the second region of the semiconductor pattern.

2. The thin-film transistor of claim 1, wherein the semiconductor pattern further has a third region connected between the first region and the second region, the source electrode and the drain electrode respectively cover the first region and the second region, the source electrode and the drain electrode expose the third region, and the thin-film transistor further comprises:
    a plurality of third island patterns disposed on the third region of the semiconductor pattern, wherein the plurality of third island patterns are separated from each other by third gaps, and the third gaps expose a portion of the third region, and a material of the third island patterns is an insulating material.

3. The thin-film transistor of claim 2, wherein the thin-film transistor further comprises:
    a plurality of fourth island patterns and a plurality of fifth island patterns respectively disposed at two sides of the semiconductor pattern and located on the insulating layer, wherein the source electrode and the drain electrode further respectively cover the plurality of fourth island patterns and the plurality of fifth island patterns, and a material of the fourth island patterns and the fifth island patterns is an insulating material.

4. The thin-film transistor of claim 3, wherein the thin-film transistor further comprises:
    a plurality of sixth island patterns disposed on the semiconductor pattern and a portion of the insulating layer exposed by the source electrode and the drain electrode, and a material of the sixth island patterns is an insulating material.

5. The thin-film transistor of claim 1, wherein the semiconductor pattern further has a third region connected between the first region and the second region, the source and the drain expose the third region of the semiconductor pattern, and the plurality of first island patterns and the plurality of second island patterns expose the third region of the semiconductor pattern and the portion of the insulating layer exposed by the semiconductor pattern, the source, and the drain.

6. The thin-film transistor of claim 5, wherein the thin-film transistor further comprises:
    a plurality of fourth island patterns and a plurality of fifth island patterns respectively disposed at two sides of the semiconductor pattern and located on the insulating layer, wherein the source and the drain further respectively cover the plurality of fourth island patterns and the plurality of fifth island patterns.

7. The thin-film transistor of claim 1, wherein the plurality of first island patterns and the plurality of second island patterns are randomly distributed on the first region and the second region of the semiconductor pattern.

8. The thin-film transistor of claim 1, wherein sizes of the plurality of island patterns are not consistent, and sizes of the second island patterns are not consistent.

* * * * *